(12) United States Patent
Ogura et al.

(10) Patent No.: US 9,583,441 B2
(45) Date of Patent: Feb. 28, 2017

(54) SEMICONDUCTOR DEVICE

(71) Applicant: RENESAS ELECTRONICS CORPORATION, Kanagawa (JP)

(72) Inventors: Takashi Ogura, Ibaraki (JP); Tatsuya Usami, Ibaraki (JP); Satoshi Kodama, Kanagawa (JP); Shuuichirou Ueno, Ibaraki (JP); Satoshi Itou, Ibaraki (JP); Takamasa Itou, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/809,070

(22) Filed: Jul. 24, 2015

(65) Prior Publication Data
US 2016/0043036 A1    Feb. 11, 2016

(30) Foreign Application Priority Data

Aug. 7, 2014  (JP) ................. 2014-161040

(51) Int. Cl.
*H01L 29/00*  (2006.01)
*H01L 23/532*  (2006.01)
*H01L 27/108*  (2006.01)
*H01L 21/768*  (2006.01)

(52) U.S. Cl.
CPC .. *H01L 23/53266* (2013.01); *H01L 21/76829* (2013.01); *H01L 21/76831* (2013.01); *H01L 21/76841* (2013.01); *H01L 21/76843* (2013.01); *H01L 23/5329* (2013.01); *H01L 27/10885* (2013.01); *H01L 23/53223* (2013.01); *H01L 23/53295* (2013.01); *H01L 2924/0002* (2013.01)

(58) Field of Classification Search
CPC ......... H01L 23/53266; H01L 21/76831; H01L 21/76829; H01L 21/76841; H01L 21/76843; H01L 23/5329
USPC ........................................................ 257/532
See application file for complete search history.

(56) References Cited

U.S. PATENT DOCUMENTS

| 7,728,376 B2* | 6/2010 | Matsui ............... H01L 27/10852 257/296 |
| 7,763,922 B2* | 7/2010 | Arai .................. H01L 27/10852 257/301 |
| 8,193,574 B2* | 6/2012 | Asami ............... H01L 27/11519 257/314 |
| 2014/0210087 A1* | 7/2014 | Kang ................ H01L 23/53233 257/751 |
| 2014/0367774 A1* | 12/2014 | Yoo ..................... H01L 29/4236 257/330 |

FOREIGN PATENT DOCUMENTS

JP   2002-134477 A   5/2002

* cited by examiner

*Primary Examiner* — Luan C Thai
(74) *Attorney, Agent, or Firm* — McDermott Will & Emery LLP

(57) ABSTRACT

A conductor provided in an interconnection layer is allowed to have a low resistance. An insulator film is provided over a substrate, and is comprised of $SiO_{(1-x)}N_x$ (where x>0.5 in an XRD analysis result). An interconnection is provided over the insulator film, and includes a first layer and a second layer. The first layer includes at least one of TiN, TaN, WN, and RuN. The second layer is provided over the first layer, and is formed of a material having a resistance lower than the first layer, for example, W.

9 Claims, 13 Drawing Sheets

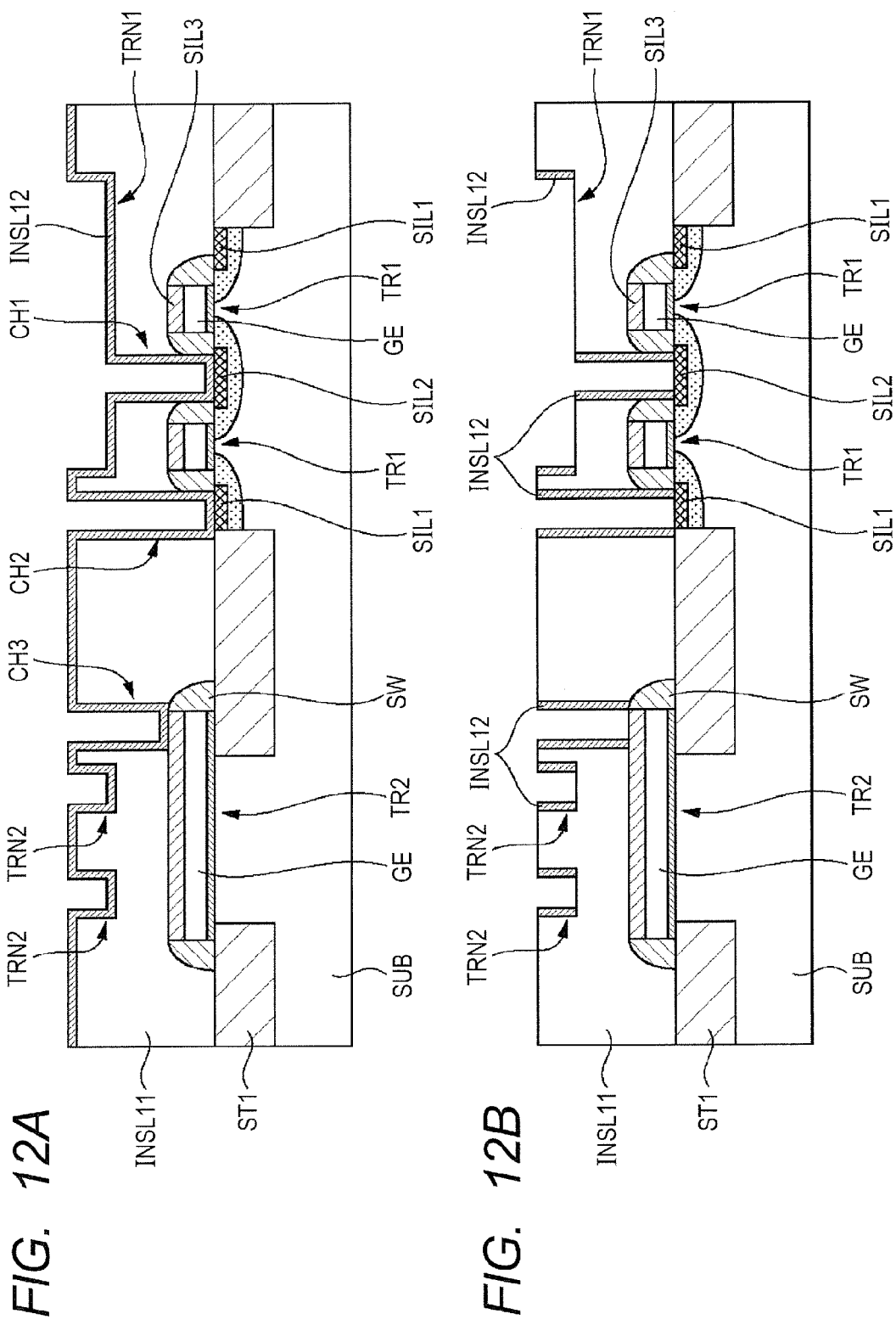

SEMICONDUCTOR DEVICE

CROSS-REFERENCE TO RELATED APPLICATIONS

The disclosure of Japanese Patent Application No. 2014-161040 filed on Aug. 7, 2014 including the specification, drawings and abstract is incorporated herein by reference in its entirety.

BACKGROUND

The present invention relates to a semiconductor device, and provides a technique applicable to a semiconductor device including, for example, interconnections.

In one DRAM configuration, a bit line is disposed in a layer below a capacitive element. For example, as described in Japanese Unexamined Patent Application Publication No. 2002-134477 (JP-A-2002-134477), the bit line in such a configuration typically has a structure where a tungsten layer is stacked on a titanium nitride layer. In JP-A-2002-134477, the bit line is provided on a silicon oxide film.

SUMMARY

Recently, the semiconductor device has been increasingly reduced in size. Accordingly, width of an interconnection has been increasingly reduced. As a result, resistance of the interconnection has been gradually increased. An increase in resistance of a conductor such as the interconnection increases power consumption of the semiconductor device, and slows down the operation speed of the semiconductor device. It is therefore desired to reduce the resistance of the conductor provided in the interconnection layer. Other issues and novel features will be clarified from the description of this specification and the accompanying drawings.

According to one embodiment of the invention, there is provided a semiconductor device, in which a conductive layer is provided over an insulator layer, and includes a first layer and a second layer. The insulator layer is comprised of $SiO_{(1-x)}N_x$ (where x>0.1). The first layer includes at least one of TiN, TaN, WN, and RuN. The second layer is provided over the first layer.

According to the one embodiment of the invention, resistance of a conductor provided in the interconnection layer can be lowered.

BRIEF DESCRIPTION OF THE DRAWINGS

FIG. 12A and FIG. 12B include sectional diagrams illustrating a method of manufacturing the semiconductor device illustrated in FIG. 11;

DETAILED DESCRIPTION

Hereinafter, some embodiments are described with reference to accompanying drawings. In all the drawings, like components are designated by like numerals, and duplicated description is appropriately omitted.

First Embodiment

Figure 1:
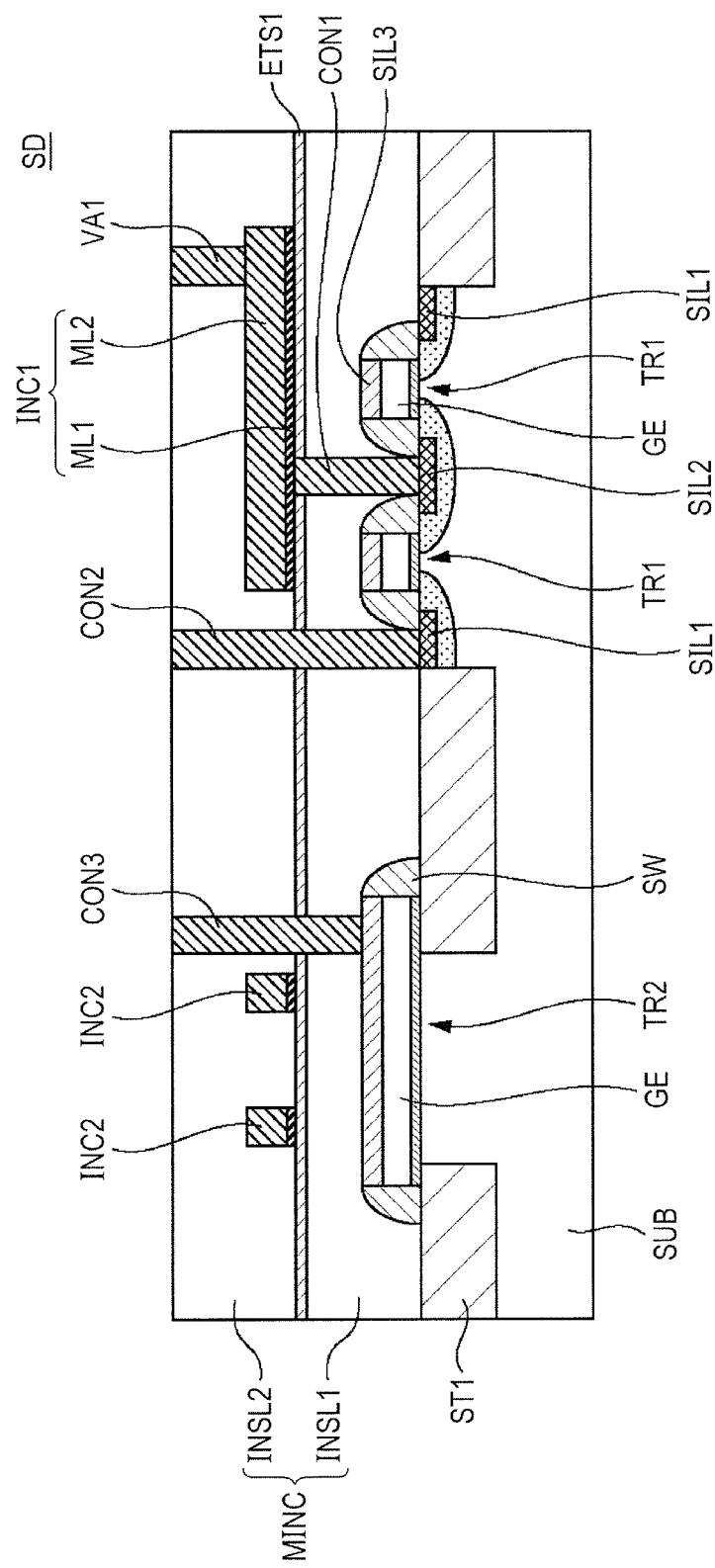
FIG. 1 is a sectional diagram illustrating a configuration of a semiconductor device according to a first embodiment.

FIG. 1 is a sectional diagram illustrating a configuration of a semiconductor device SD according to a first embodiment. The semiconductor device SD includes a substrate SUB, an insulator film ETS1, and interconnections INC1. The insulator film ETS1 is provided on the substrate SUB, and comprised of $SiO_{(1-x)}N_x$ (where x>0.5 in a result of analysis by X-ray Photoelectron Spectroscopy (XPS)). Each interconnection INC1 is provided on the insulator film ETS1, and includes a first layer ML1 and a second layer ML2. The first layer ML1 includes at least one of TiN, TaN, WN, and RuN. The second layer ML2 is provided on the first layer ML1, and is formed of a material having a resistance lower than the first layer ML1, for example, W. The configuration is now described in detail.

The substrate SUB is a semiconductor substrate including, for example, silicon. Transistors TR1 and TR2 and an element isolation film STI are provided in/on the substrate SUB. The element isolation film STI isolates a region having the transistor TR1 (first element formation region) from a region having the transistor TR2 (second element formation region). The element isolation film STI is formed by, for example, a trench isolation process, but may be formed by a local oxidation of silicon (LOCOS) process.

Each of the transistors TR1 and TR2 has a gate insulating film, a gate electrode GE, a source, and a drain. The gate insulating film is formed, for example, through thermal oxidation of the substrate SUB, but may be formed of another material (for example, a material having a dielectric constant higher than silicon oxide) or formed by another method. The gate electrode GE is formed of, for example, a polysilicon film, and has a sidewall covered with s sidewall SW. However, the gate electrode GE may be formed of a metal film including, for example, TiN. The sidewall SW is formed of at least one of a silicon oxide film and a silicon nitride film, for example.

A silicide SIL3 is provided in the surface of the gate electrode GE. A silicide SIL1 is provided in the surface of the drain of each of the transistors TR1 and TR2, and a silicide SIL2 is provided in the surface of the source of each of the transistors TR1 and TR2. The silicides SIL1 to SIL3 are each, for example, Ni silicide or Co silicide, but may be a silicide of another metal. The transistors TR1 and TR2 may configure circuits equal to or different from each other.

A multilayer interconnection layer MINC is provided on the substrate SUB. In the exemplary case illustrated in FIG. 1, the multilayer interconnection layer MINC has a configuration where a first interlayer insulator film INSL1, the insulator film ETS1, and a second interlayer insulator film INSL2 are stacked in this order. The interconnection INC1 is provided on the insulator film ETS1.

The interlayer insulator films INSL1 and INSL2 are each formed of, for example, one of $SiO_2$, SiCON, and SiOC. The interlayer insulator films INSL1 and INSL2 are each preferably formed of a material that releases oxygen more poorly than $SiO_2$ (for example, SiCON or SiOC). The interlayer insulator films INSL1 and INSL2 may each be a porous film of such a material. The elements are contained at various rates in each of the interlayer insulator films INSL1 and INSL2. Each of the insulator films INSL1 and INSL2 may include a SiN film at least partially.

The insulator film ETS1 is comprised of $SiO_{(1-x)}N_x$, where $x>0.1$, preferably $x>0.5$, and acceptably $x=1$. The insulator film ETS1 has a thickness smaller than that of the interlayer insulator film INSL1, for example, 10 to 100 nm, preferably 30 to 70 nm. Since the insulator film ETS1 has an etching selectivity higher than that of the interlayer insulator film INSL2, it serves as an etching stopper for formation of a coupling hole in the interlayer insulator film INSL2.

The interconnection INC1 is provided on the insulator film ETS1. The interconnection INC1 has a configuration where the second layer ML2 as a main part of the interconnection INC1 is stacked on the first layer ML1 as a barrier metal film. The interconnection INC1 has a width of, for example, 65 nm or less. The width may be 28 nm or less.

The first layer ML1 includes at least one of $TiN_y$, $TaN_y$, $WN_y$, and $RuN_y$ (where $0<y<1$). For example, the first layer ML1 includes one of a TiN film, a TaN film, a WN film, and a RuN film. In such a material of the first layer ML1, $0.5<y<1$ is preferred. The first layer ML1 has a thickness of, for example, 2.5 to 50 nm. The first layer ML1 is formed by, for example, a reactive sputtering process.

The second layer ML2 is formed of one of a W film, an Al film, an AlCu film, and an AlSiCu film, for example. The second layer ML2 has a thickness of, for example, 30 to 100 nm. The second layer ML2 is formed by, for example, a sputtering process.

The interconnection INC1 is coupled to one of the source and the drain of the transistor TR1 via a contact CON1 embedded in the interlayer insulator film INSL1 and in the insulator film ETS1. The contact CON1 is located in a coupling hole provided in the interlayer insulator film INSL1 and the insulator film ETS1, and is formed of a barrier metal film including, for example, TiN and W. In the exemplary case illustrated in FIG. 1, the contact CON1 is embedded only in the interlayer insulator film INSL1. The first layer ML1 of the interconnection INC1 fills a portion of the coupling hole, the portion vertically corresponding to the insulator film ETS1.

The interlayer insulator film INSL2 is provided on the interconnection INC1 and the insulator film ETS1. A via VA1 is embedded in the interlayer insulator film INSL2. The via VA1 is coupled to the interconnection INC1. The via VA1 is formed of a barrier metal film, for example, a TiN film, and Cu or W.

The multilayer interconnection layer MINC further includes contacts CON2 and CON3 and interconnections INC2.

The contacts CON2 and CON3 each penetrate through the interlayer insulator film INSL2, the insulator film ETS1, and the interlayer insulator film INSL1. The contact CON2 is coupled to the other of the source and the drain of the transistor TR1. The contact CON3 is coupled to the gate electrode GE of the transistor TR2. The contacts CON2 and CON3 are each formed of a barrier metal film, for example, a TiN film, and Cu or W.

Each interconnection INC2 is located on the insulator film ETS1, and has a configuration similar to that of the interconnection INC1. The interconnection INC2 configures a circuit together with the transistor TR2.

A method of manufacturing the semiconductor device SD illustrated in FIG. 1 is now described. First, the element isolation film STI is formed in the substrate SUB. Subsequently, the gate insulator film and the gate electrode GE of each of the transistors TR1 and TR2 are formed, and then the sidewall SW is formed. Subsequently, impurity ions are implanted into the substrate SUB to form the source and the drain of each of the transistors TR1 and TR2. Subsequently, the silicides SIL1, SIL2, and SIL3 are formed.

Subsequently, the interlayer insulator film INSL1 is formed over the substrate SUB by, for example, a thermal CVD process or a plasma CVD process. Subsequently, the coupling hole is formed in the interlayer insulator film INSL1, and is then filled with the contact CON1. In this step, the contacts CON2 and CON3 may be partially formed to provide portions of the contacts CON2 and CON3, the portions being located in the interlayer insulator film INSL1.

Subsequently, the insulator film ETS1 is formed over the interlayer insulator film INSL1 by, for example, a plasma CVD process. Subsequently, an opening is formed in the insulator film ETS1. The opening is located on the contact CON1. Subsequently, a conductive film to be the first layer ML1 is formed in the opening of the insulator film ETS1 and over the insulator film ETS1, and then another conductive film to be the second layer ML2 is formed over such a conductive film. The second layer ML2 is first formed at low temperature and low deposition rate, and then formed at high temperature and high deposition rate. Subsequently, a resist pattern is formed over the stacked film of the conductive films, and the stacked film is etched with the resist pattern as a mask. Consequently, the interconnections INC1 and INC2 are formed.

Subsequently, the interlayer insulator film INSL2 is formed over the insulator film ETS1 and over the interconnections INC1 and INC2 by, for example, a plasma CVD process. Subsequently, the coupling holes to be filled with the via VA1 and the contacts CON2 and CONS are formed, and are then filled with those.

As described above, in the first embodiment, the interconnections INC1 and INC2 each have a configuration where the second layer ML2 is provided on the first layer ML1. The first layer ML1 is provided on the insulator film ETS1. The first layer ML1 includes at least one of $TiN_y$, $TaN_y$, $WN_y$, and $RuN_y$ (where $0<y<1$). The second layer ML2 is one of a W film, an Al film, an AlCu film, and an AlSiCu film, for example. The insulator film ETS1 is a $SiO_{(1-x)}N_x$ (where $x>0.1$) film. The insulator film ETS1 is therefore less likely to adsorb moisture and oxygen than the silicon oxide film. Hence, a small amount of oxygen atoms exist in a region of the first layer ML1 on a side close to the insulator film ETS1 compared with a case where the insulator film ETS1 is a silicon oxide film. Consequently, the first layer ML1 has a large crystal grain size compared with the case where the insulator film ETS1 is a silicon oxide film. Accordingly, the second layer ML2 also has a large crystal grain size compared with the case where the insulator film ETS1 is a silicon oxide film. Hence, each of the interconnections INC1 and INC2 has a low resistance. Such an effect is now demonstrated with data.

Figure 2:
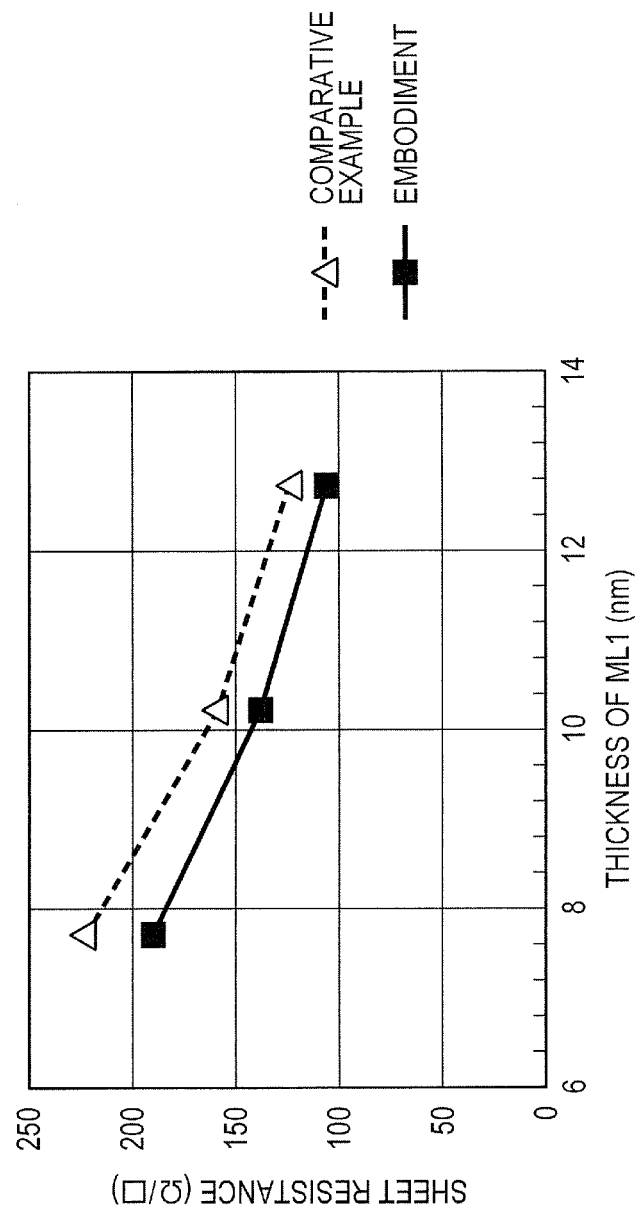
FIG. 2 is a graph illustrating a sheet resistance value of a TiN film formed on a $SiO_{(1-x)}N_x$ film as a function of thickness of the TiN film.

FIG. 2 is a graph illustrating a sheet resistance value of the TiN film formed on the $SiO_{(1-x)}N_x$ (where x>0.1) film (i.e., the first layer ML1) as a function of thickness of the TiN film. FIG. 2 also illustrates, as a comparative example, a sheet resistance value of a TiN film formed on a $SiO_2$ film. FIG. 2 reveals that a low sheet resistance value of the TiN film is given by forming the TiN film over the $SiO_{(1-x)}N_x$ (where x>0.1) film. This demonstrates that the first layer ML1 has a low sheet resistance value by using the $SiO_{(1-x)}N_x$ (where x>0.1) film as the insulator film ETS1.

Figure 3:
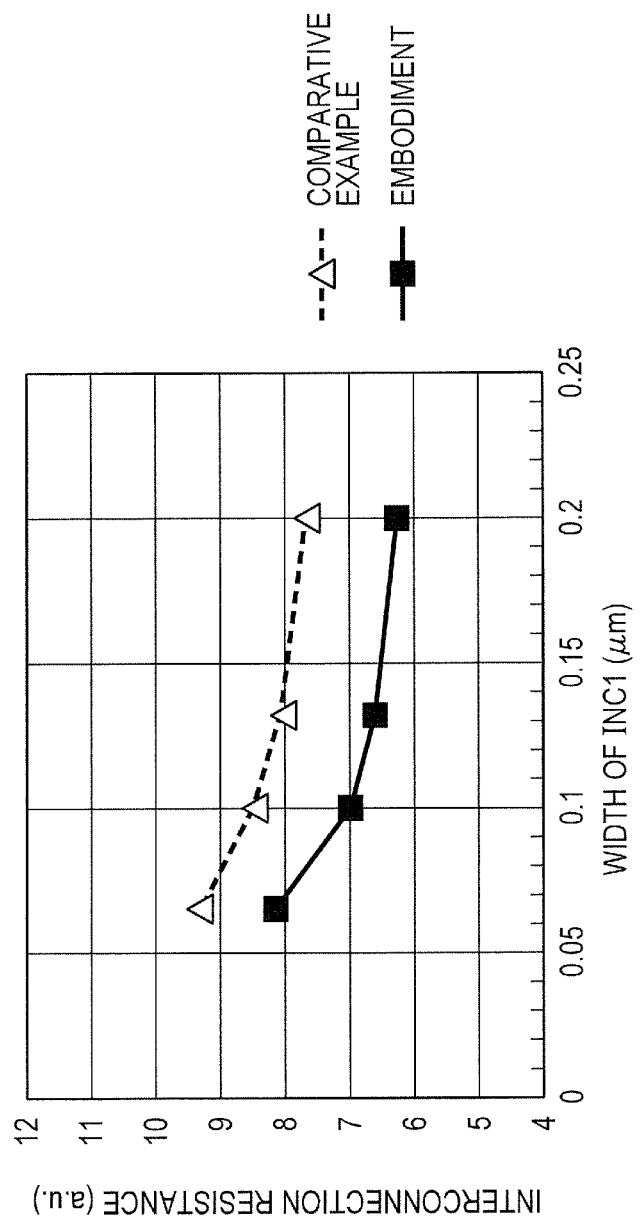
FIG. 3 is a graph illustrating a resistance value of an interconnection formed on an insulator film comprised of a $SiO_{(1-x)}N_x$ film as a function of width of the interconnection.

FIG. 3 is a graph illustrating a resistance value of the interconnection INC1 formed on the insulator film ETS1 comprised of the $SiO_{(1-x)}N_x$ (where x>0.1) film as a function of width of the interconnection INC1. FIG. 3 also illustrates, as a comparative example, a sheet resistance value of the interconnection INC1 when a $SiO_2$ film is used as the insulator film ETS1. In each of the samples shown in FIG. 3, the first layer ML1 of the interconnection INC1 is a TiN film, and the second layer ML2 thereof is a W film.

FIG. 3 demonstrates that using the $SiO_{(1-x)}N_x$ (where x>0.1) film as the insulator film ETS1 gives low resistance of the interconnection INC1 compared with a case where a $SiO_2$ film is used as the insulator film ETS1.

Figure 4:
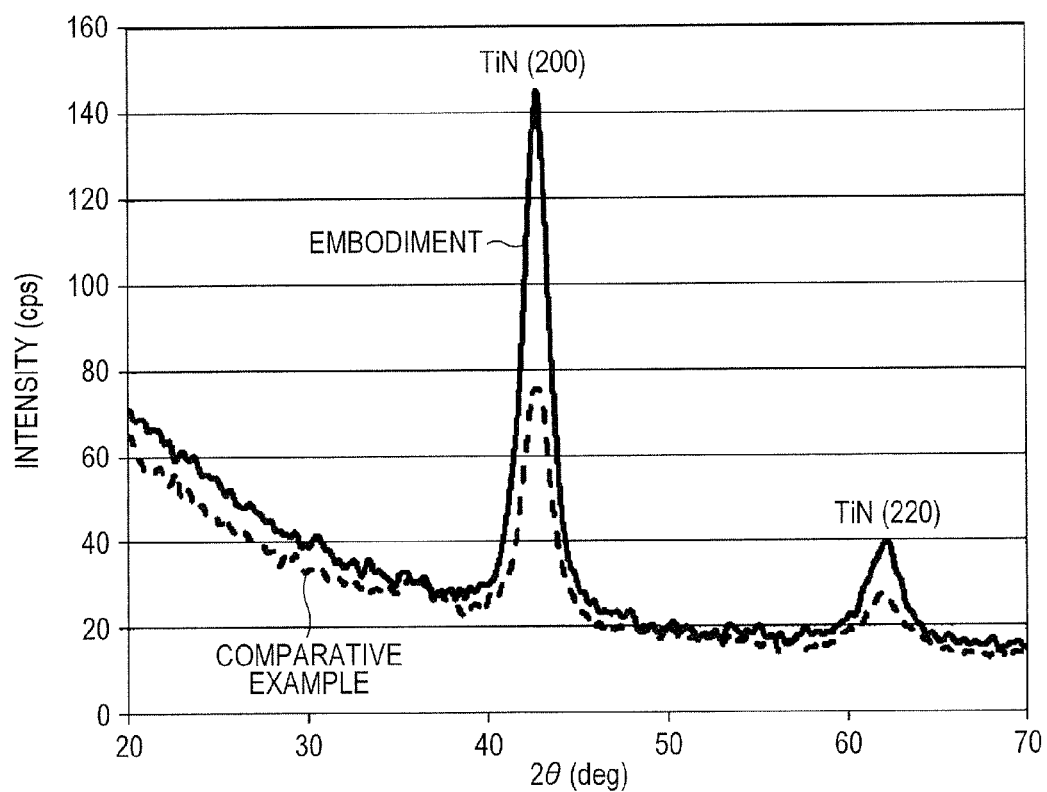
FIG. 4 is an XRD chart of the TiN film of each sample shown in FIG. 2.

FIG. 4 is an XRD chart of the TiN film of each sample shown in FIG. 2. FIG. 4 reveals that the TiN film formed on the $SiO_{(1-x)}N_x$ (where x>0.1) film (first embodiment) has a crystal grain size larger than the TiN film formed on the $SiO_2$ film (comparative example). As a result of measurement of such crystal grain sizes using SEM images, while average grain size is 29 nm in the first embodiment, it is 26 nm in the comparative example.

Figure 5:
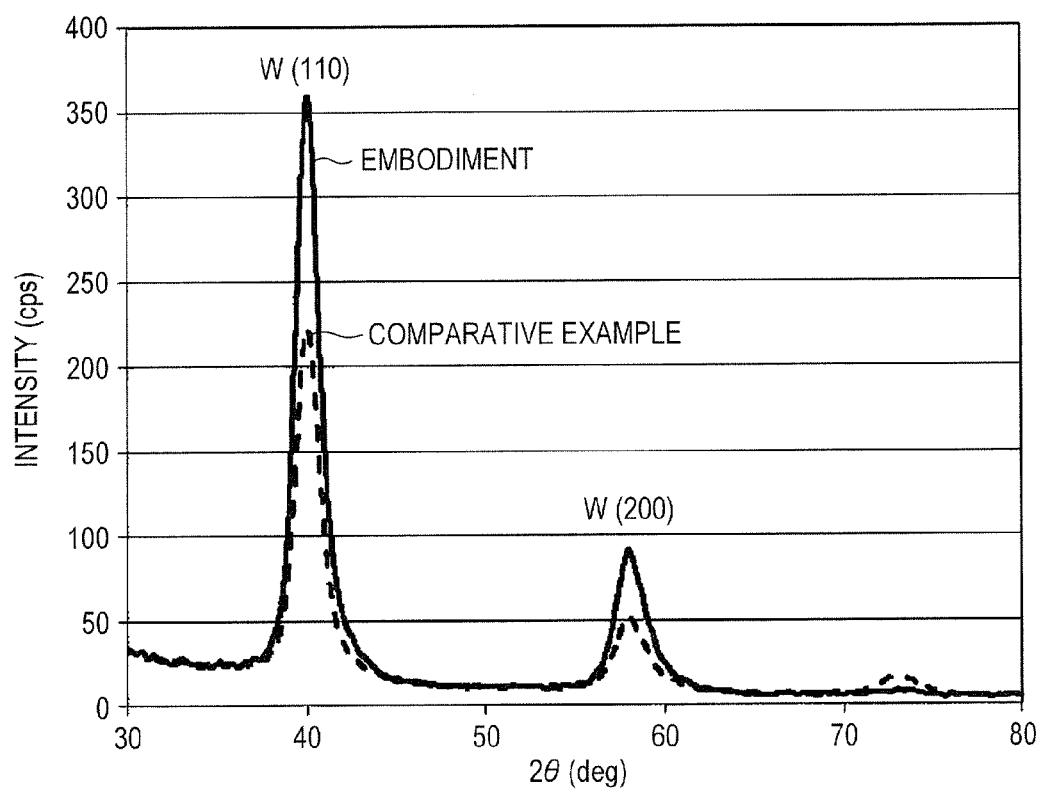
FIG. 5 is an XRD chart of a second layer of each sample shown in FIG. 3.

FIG. 5 is an XRD chart of the second layer ML2 of each sample shown in FIG. 3. FIG. 5 reveals that the second layer ML2 formed on the $SiO_{(1-x)}N_x$ (where x>0.1) film (first embodiment) has a crystal grain size larger than the second layer ML2 formed on the $SiO_2$ film (comparative example).

Figure 6:
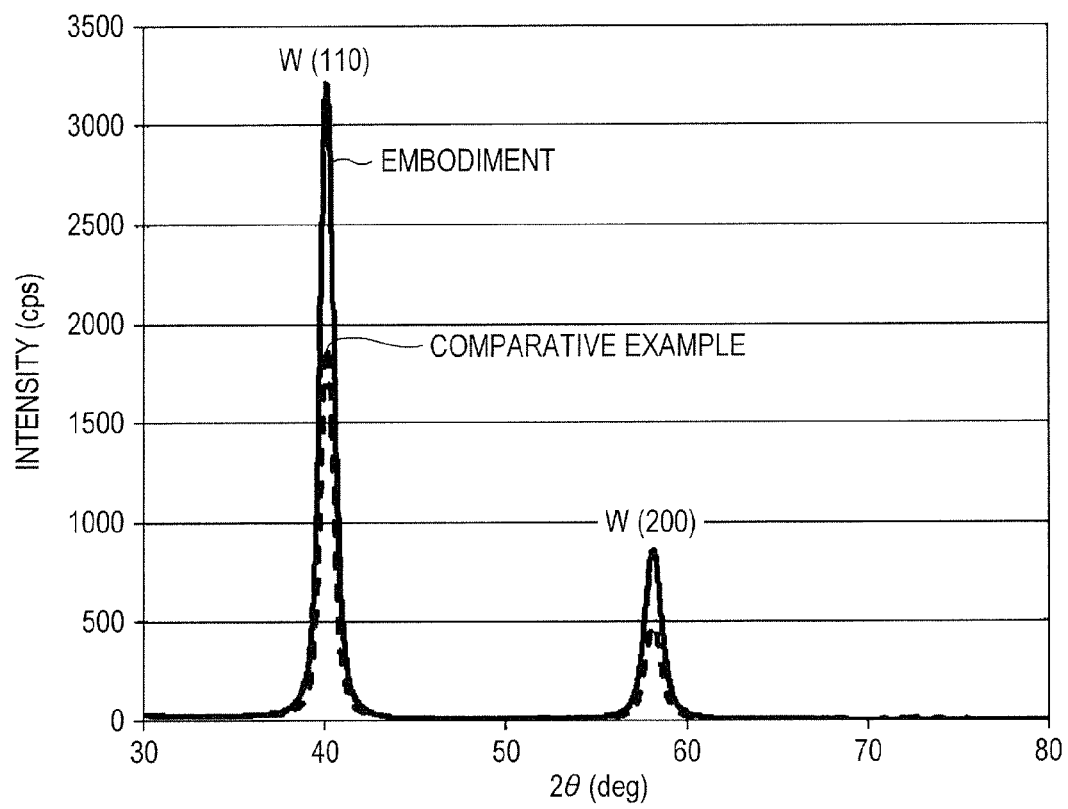
FIG. 6 is an XRD chart of an initial layer (a layer formed at a low deposition rate) of the second layer of each sample shown in FIG. 3.

FIG. 6 is an XRD chart of an initial layer (a layer formed at a low deposition rate) of the second layer ML2 of each sample shown in FIG. 3. FIG. 6 reveals that the initial layer formed on the $SiO_{(1-x)}N_x$ (where x>0.1) film (first embodiment) has a crystal grain size larger than the initial layer formed on the $SiO_2$ film (comparative example).

Figure 7:
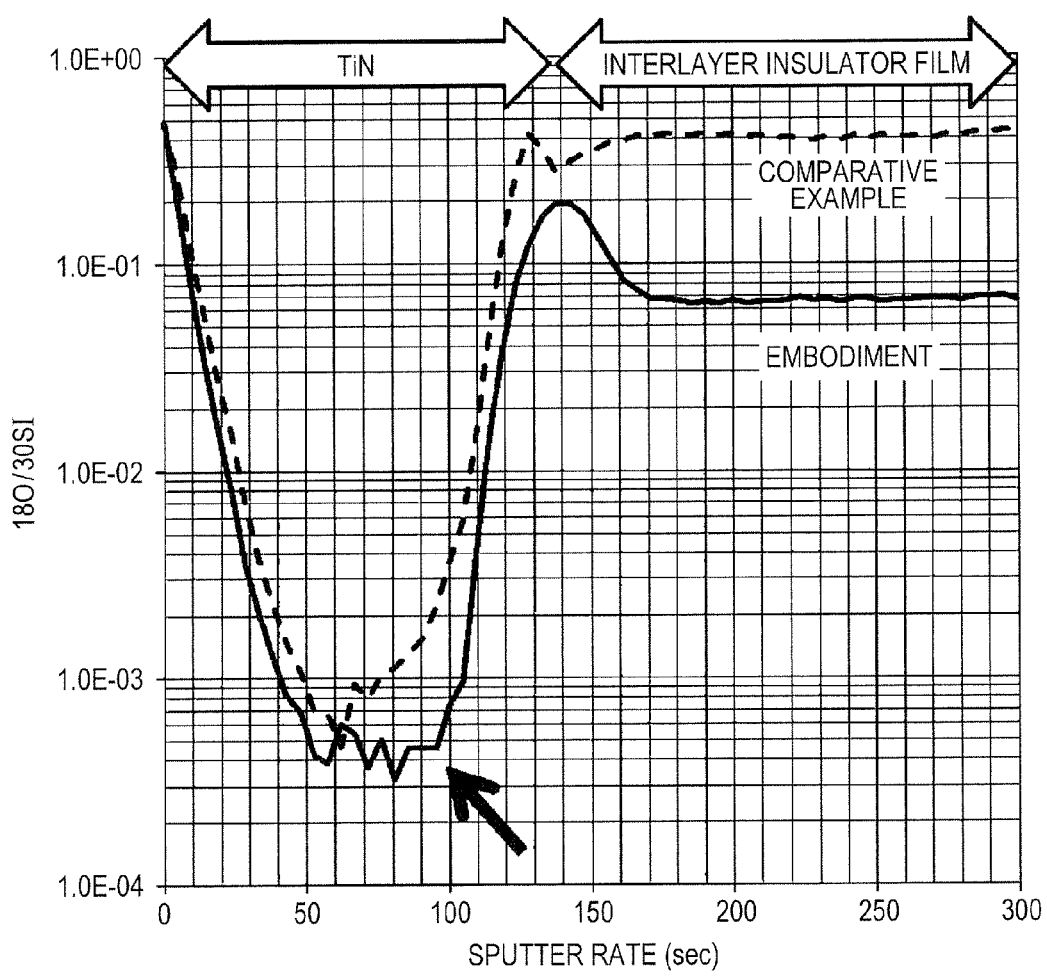
FIG. 7 is a diagram illustrating a result of SIMS analysis of a profile in a depth direction of oxygen concentration of the TiN film of each sample shown in FIG. 2.

FIG. 7 illustrates a result of SIMS analysis of a profile in a depth direction of oxygen concentration of the TiN film of each sample shown in FIG. 2. FIG. 7 reveals that oxygen concentration of the TiN film formed on the $SiO_{(1-x)}N_x$ (where x>0.1) film (first embodiment) is lower than that of the TiN film formed on the $SiO_2$ film (comparative example). Such a tendency is notable in a portion of the TiN film, the portion being near the $SiO_{(1-x)}N_x$ (where x>0.1) film (i.e., a film region below the thickness center). The profile of oxygen concentration in the thickness direction is not asymmetric with reference to the thickness center of the TiN film (first layer ML1). This tendency is also given when another metal is used for the first layer ML1.

Figure 8:
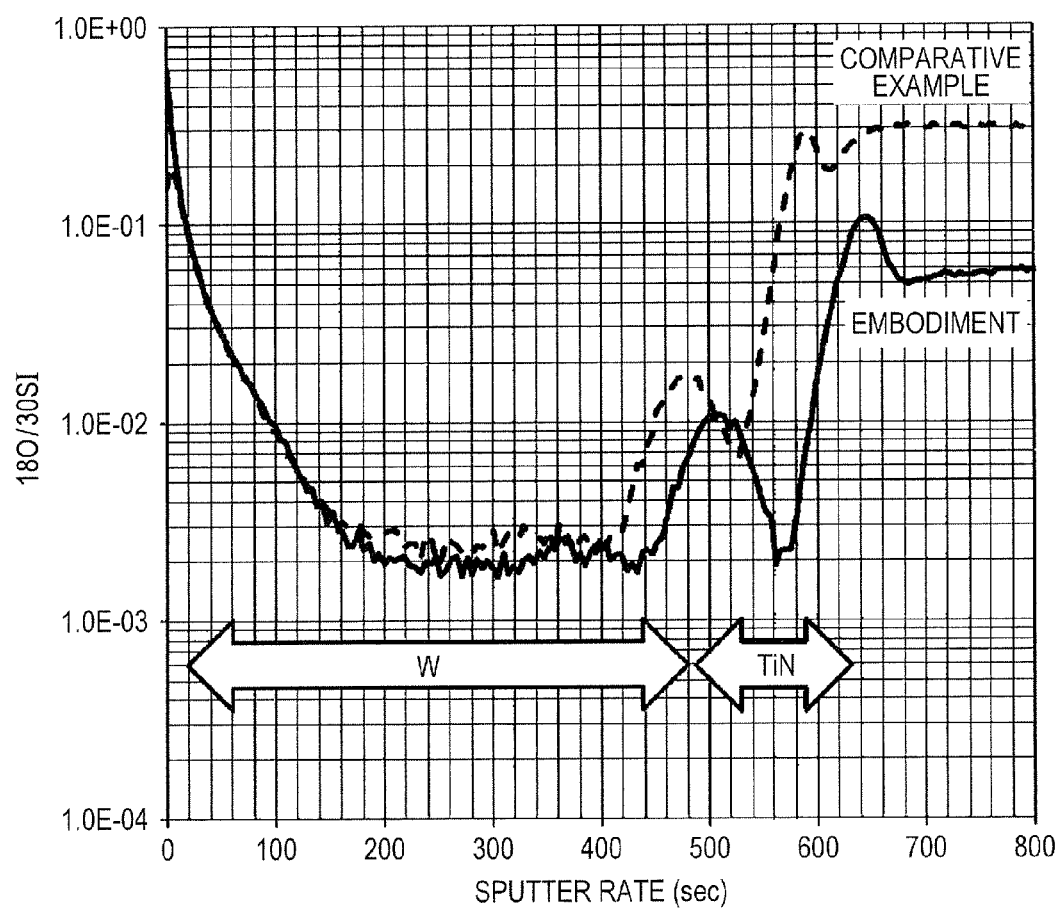
FIG. 8 is a diagram illustrating a result of SIMS analysis of a profile in a depth direction of oxygen concentration of the interconnection of each sample shown in FIG. 3.

FIG. 8 illustrates a result of SIMS analysis of a profile in a depth direction of oxygen concentration of the interconnection INC1 of each sample shown in FIG. 3. FIG. 8 reveals that the oxygen concentration of the first layer ML1 has a tendency similar to that shown in FIG. 7.

Figure 9:
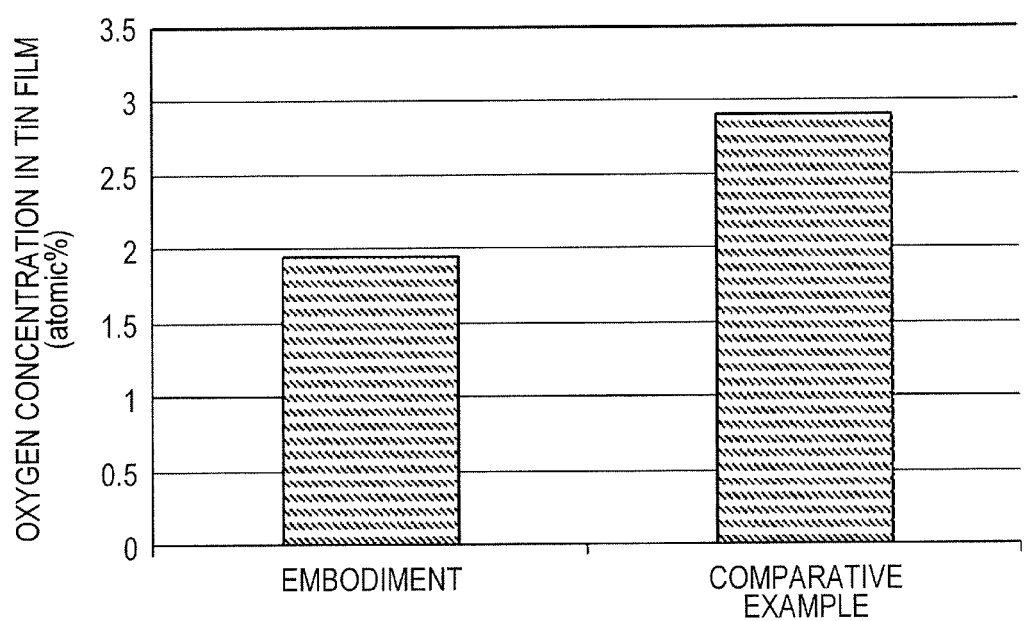
FIG. 9 is a diagram illustrating concentration of oxygen contained in the TiN of each sample shown in FIG. 2.

FIG. 9 illustrates a result of XPS measurement of concentration of oxygen contained in the TiN film (first layer ML1) in each of the first embodiment and the comparative example shown in FIG. 2. FIG. 9 demonstrates that the amount of oxygen contained in the TiN film according to the first embodiment is smaller (specifically, 2 at % or less) than the amount of oxygen contained in the TiN film according to the comparative example. When another metal is used for the first layer ML, the concentration of oxygen contained in the first layer ML1 according to the first embodiment is also smaller (specifically, 2 at % or less) than the concentration of oxygen contained in the first layer ML1 according to the comparative example.

Although the first layer ML1 is the TiN film and the second layer ML2 is the W film in the exemplary case shown in FIGS. 2 to 8, it is clear that a similar tendency is also given when the first layer ML1 includes one of TaN, WN, and RuN, and when the second layer ML2 is one of an Al film, an AlCu film, and an AlSiCu film.

Second Embodiment

Figure 10:
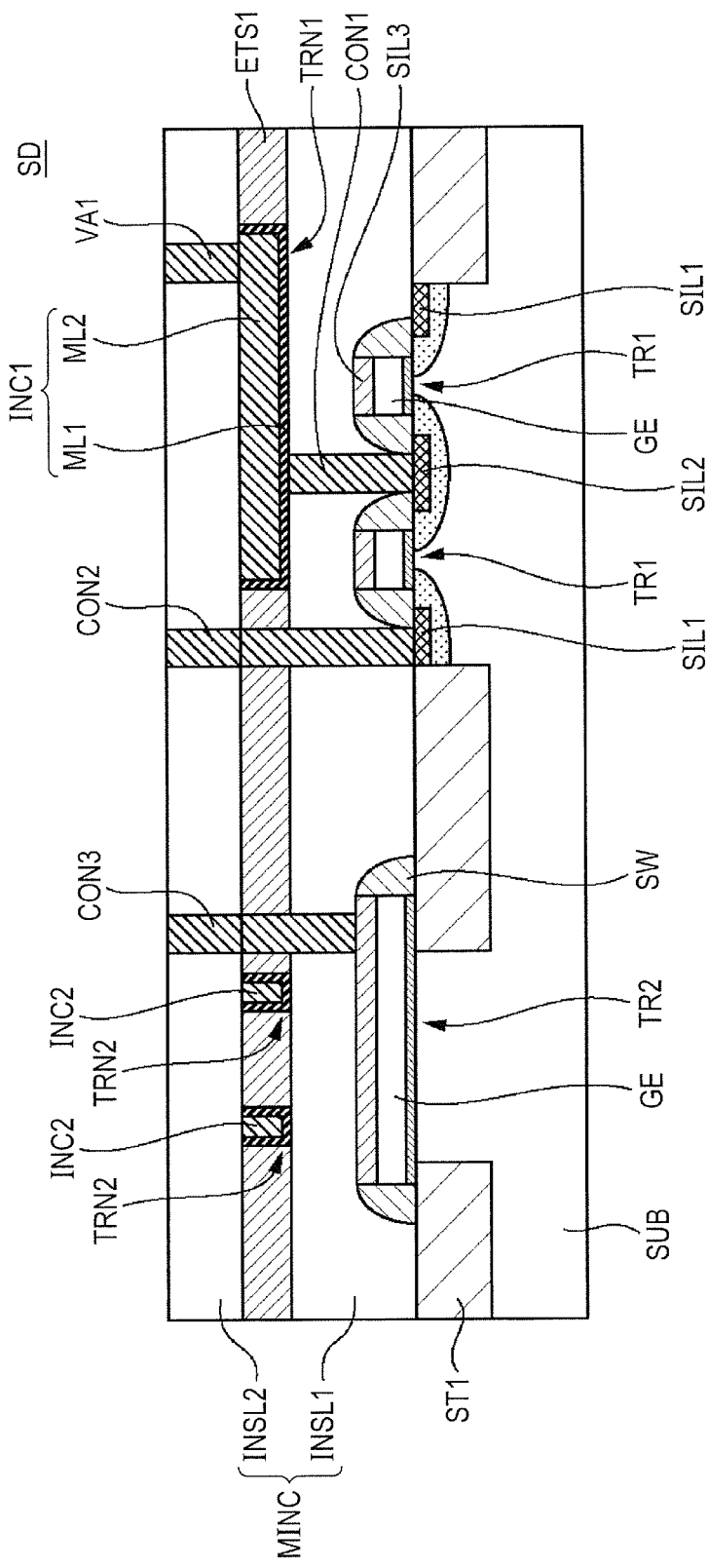
FIG. 10 is a diagram illustrating a configuration of a semiconductor device according to a second embodiment.

FIG. 10 is a diagram illustrating a configuration of a semiconductor device SD according to a second embodiment. The semiconductor device SD according to the second embodiment has a configuration similar to that of the semiconductor device SD according to the first embodiment except that the interconnections INC1 and INC2 are embedded in the insulator film ETS1 by a damascene process.

Specifically, the insulator film ETS1 is formed of the same material as that in the first embodiment, and has a thickness of, for example, 50 to 180 nm. The insulator film ETS1 has a trench TRN1 in a region where the interconnection INC1 is to be provided, and a trench TRN2 in a region where the interconnection INC2 is to be provided. The trenches TRN1 and TRN2 each penetrate through the insulator film ETS1. However, the trenches TRN1 and TRN2 may each not penetrate through the insulator film ETS1. The first layer ML1 is provided over the bottom and the side face of each of the trenches TRN1 and TRN2. The second layer ML2 fills the remaining space of each of the trenches TRN1 and TRN2.

A method of manufacturing the semiconductor device SD according to the second embodiment is similar to the method of manufacturing the semiconductor device SD according to the first embodiment except for a formation process of each of the interconnections INC1 and INC2. In the second embodiment, the interconnections INC1 and INC2 are formed in the following manner.

First, the insulator film ETS1 is formed, and then a resist pattern is formed over the insulator film ETS1. Subsequently, the insulator film ETS1 is etched with the resist pattern as a mask. At this time, the interlayer insulator film INSL1 serves as an etching stopper. Consequently, the trenches TRN1 and TRN2 are formed. Subsequently, a conductive film to be the first layer ML1 is formed over the bottom and the side face of each of the trenches TRN1 and TRN2 and over the insulator film ETS1. The conductive film is formed by, for example, an organic-gas CVD process, a low-pressure CVD process, or an ALD process, and has a thickness of, for example, 5 nm or less. Subsequently, another conductive film to be the second layer ML2 is formed over such a conductive film. Subsequently, the two conductive films located on the insulator film ETS1 are removed by a CMP process or an etch back process. Consequently, the interconnections INC1 and INC2 are formed.

In the second embodiment, at least the side face of the first layer ML1 is also in contact with the insulator film ETS1. Consequently, the first layer ML1 contains a small amount of oxygen, and thus has a large crystal grain size. Accordingly, the second layer ML2 also has a large crystal grain size. As a result, the interconnections INC1 and INC2 each have a low resistance.

In the first embodiment, the interconnections INC1 and INC2 are protrusively provided on the insulator film ETS1. Hence, when the interconnections INC1 and INC2 are each increasingly reduced in size, the interlayer insulator film INSL2 may not enter a space between such interconnections, leading to formation of voids. In such a case, short-circuit may occur between the interconnections. In contrast, in the second embodiment, since the interconnections INC1 and INC2 are embedded in the insulator film ETS1, the insulator film ETS1 necessarily exists between the adjacent interconnections INC1 and between the adjacent interconnections INC2. Hence, short-circuit is less likely to occur between the interconnections.

Third Embodiment

Figure 11:
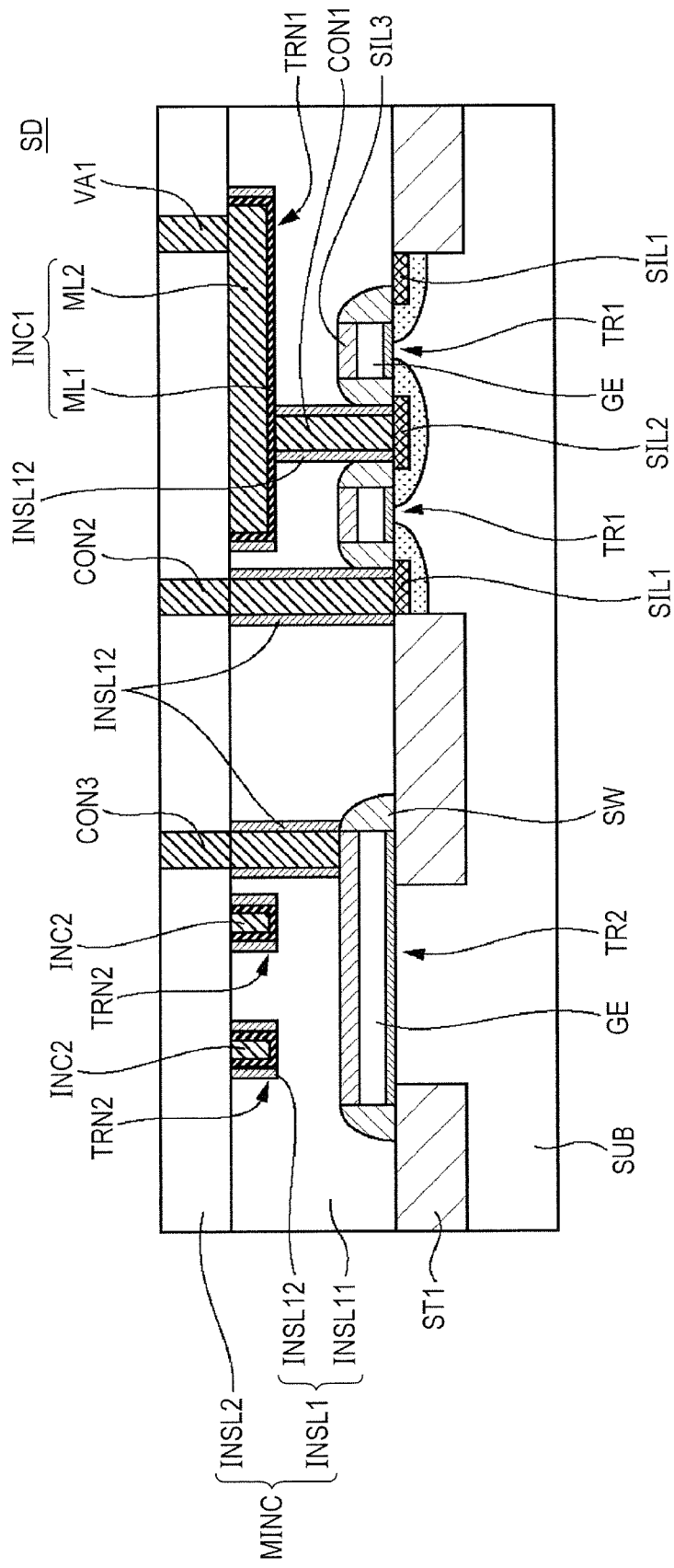
FIG. 11 is a diagram illustrating a configuration of a semiconductor device according to a third embodiment.

FIG. 11 is a diagram illustrating a configuration of a semiconductor device SD according to a third embodiment. The semiconductor device SD according to the third embodiment has a configuration similar to that of the semiconductor device SD according to the first embodiment except for the following points.

The interconnection INC1 is formed by a damascene process. The contact CON1 and portions of the contacts CON2 and CONS, the portions being located in the interlayer insulator film INSL1, are formed by the damascene process at the same time with the interconnection INC1. In the exemplary case illustrated in FIG. 11, the insulator film ETS1 is not provided on the interlayer insulator film INSL1. However, the insulator film ETS1 may be provided thereon.

The interlayer insulator film INSL1 has a first insulator layer INSL11 and a second insulator layer INSL12 (insulator layer). The first insulator layer INSL11 is a main part of the interlayer insulator film INSL1, and is formed of the same material as the material of the interlayer insulator film INSL1 in the first embodiment. The trench TRN1 and the coupling hole are provided in the interlayer insulator film INSL1. The second insulator layer INSL12 is provided over the side face of the trench TRN1 and the side face of the coupling hole. The second insulator layer INSL12 is formed of a material similar to the material of the insulator film ETS1 in the first embodiment, i.e., formed of $SiO_{(1-x)}N_x$ (x>0.1). The second insulator layer INSL12 has a thickness of, for example, 5 nm or less.

FIGS. 12A and 12B are sectional diagrams illustrating a method of manufacturing the semiconductor device SD illustrated in FIG. 11. First, as illustrated in FIG. 12A, the element isolation film STI and the transistors TR1 and TR2 are formed in the substrate SUB. The formation processes of such components are similar to those in the first embodiment. Subsequently, the first insulator layer INSL11 is formed over the substrate SUB, the element isolation film STI, and the transistors TR1 and TR2. The formation process of the first insulator layer INSL11 is similar to that of the interlayer insulator film INSL1 in the first embodiment. Subsequently, the trench TRN1 to be filled with the interconnection INC1, the trench TRN2 to be filled with the interconnection INC2, the coupling hole CH1 to be filled with the contact CON1, the coupling hole CH2 to be filled with the contact CON2, and the coupling hole CH3 to be filled with the contact CONS are formed in the interlayer insulator film INSL1.

Subsequently, the second insulator layer INSL12 is formed over the interlayer insulator film INSL1, over the bottoms and the side faces of the trenches TRN1 and TRN2, and over the bottoms and the side faces of the coupling holes CH1, CH2, and CH3. The second insulator layer INSL12 is formed by, for example, a plasma CVD process.

Subsequently, as illustrated in FIG. 12B, the second insulator layer INSL12 is etched back. Consequently, portions of the second insulator layer INSL12 are removed, the portions being located on the interlayer insulator film INSL1, on the bottoms of the trenches TRN1 and TRN2, and on the bottoms of the coupling holes CH1, CH2, and CH3.

Subsequently, a conductive film to be the first layer ML1 is formed over the bottoms and the side faces of the trenches TRN1 and TRN2, over the bottoms and the side faces of the coupling holes CH1, CH2, and CH3, and over the insulator film ETS1. Subsequently, another conductive film to be the second layer ML2 is formed over such a conductive film. The formation process of each of the first layer ML1 and the second layer ML2 is the same as that in the second embodiment. Subsequently, the two conductive films located on the insulator film ETS1 are removed by a CMP process or an etch back process. Consequently, portions of the interconnections INC1 and INC2 and portions of the contacts CON1, CON2, and CON3 are formed, such portions being located in the interlayer insulator film INSL1.

Subsequently, the interlayer insulator film INSL2, the via VA1, and portions of the contacts CON2 and CON3, the portions being located in the interlayer insulator film INSL2, are formed. The formation processes of such components are similar to those in the first embodiment.

As described above, in the third embodiment, the side face of the first layer ML1 is in contact with the second insulator layer INSL12. The second insulator layer INSL12 is formed of a material similar to the material of the insulator film ETS1 in the first embodiment. Hence, the first layer ML1 contains a small amount of oxygen, and thus has a large crystal grain size. Accordingly, the second layer ML2 also has a large crystal grain size. As a result, the interconnections INC1 and INC2 each have a low resistance. In addition, the contact CON1 and portions of the contacts CON2 and CON3, the portions being located in the first insulator layer INSL11, each also have a large crystal grain size, and thus the contact CON1, CON2, and CON3 each have a low resistance.

In addition, since the second insulator layer INSL12 is provided over the side face of each of the trenches TRN1 and TRN2, volume occupied by $SiO_{(1-x)}N_x$ in the interlayer insulator film is smaller than that in the second embodiment. This achieves low parasitic capacitance generated between the interconnections or the contacts.

Fourth Embodiment

Figure 13A:
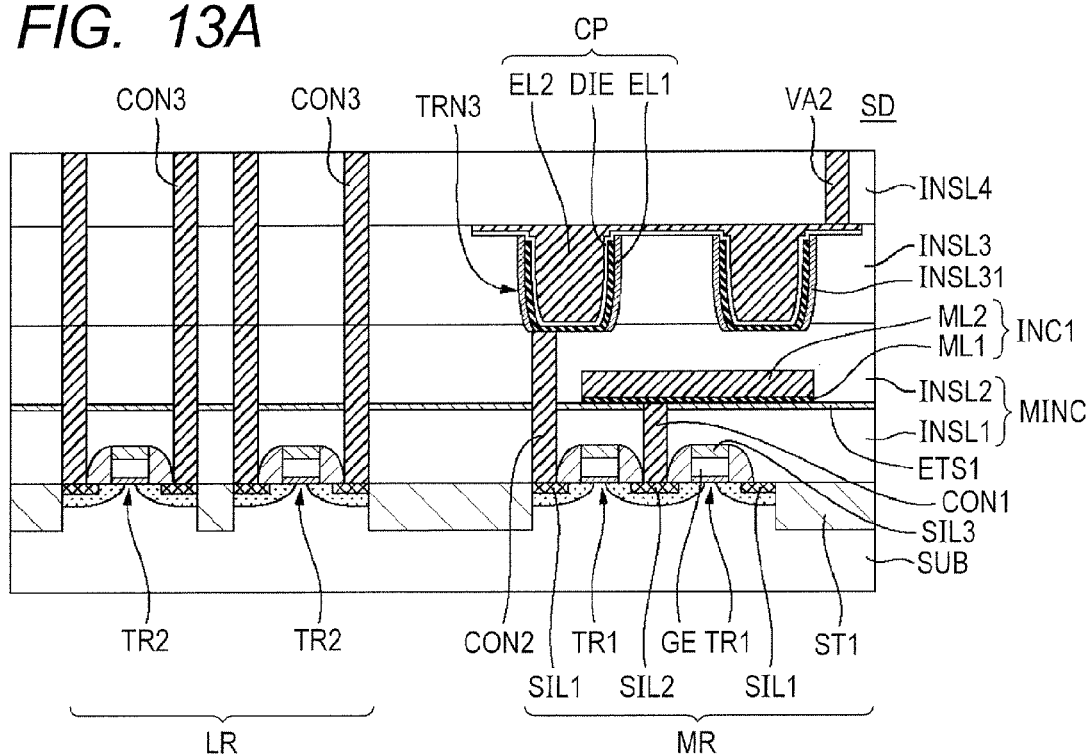
FIG. 13A is a sectional diagram illustrating a configuration of a semiconductor device according to a fourth embodiment.
Figure 13B:
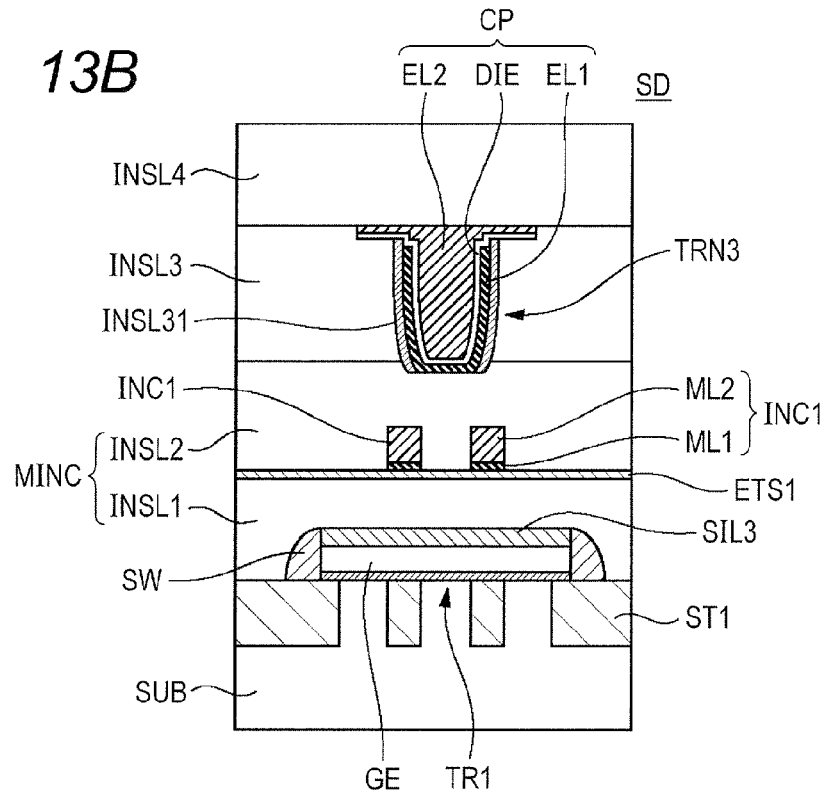
FIG. 13B is a diagram of a memory region illustrated in FIG. 13A along a section in a direction perpendicular to FIG. 13A.

FIG. 13A is a sectional diagram illustrating a configuration of a semiconductor device SD according to a fourth embodiment. FIG. 13B is a diagram of a memory region MR illustrated in FIG. 13A along a section in a direction perpendicular to FIG. 13A (a direction in which the gate electrode GE extends). The semiconductor device SD according to the fourth embodiment has a configuration similar to that of the semiconductor device SD according to the first embodiment except for the following points.

The semiconductor device SD has the memory region MR and a logic region LR. The memory region MR has capacitive elements CP and the transistors TR1, while the logic region LR has the transistors TR2. Each capacitive element CP configures part of a memory element that is controlled in writing and erasing by the transistor TR1. The transistor TR2 configures at least part of a logic circuit.

In detail, the multilayer interconnection layer MINC further includes interlayer insulator films INSL3 and INSL4 over the interlayer insulator film INSL2. Trenches TRN3 are provided in the interlayer insulator film INSL3, and are each filled with the capacitive element CP. The interlayer insulator film INSL3 may be configured of a plurality of insulator films being stacked.

The capacitive element CP has a configuration where a first electrode EL1, a dielectric layer DIE, and a second electrode EL2 are stacked in this order.

The first electrode EL1 is provided along the bottom and the side face of each trench TRN3, and is formed of a material similar to the material of the first layer ML1 of the interconnection INC1. The first electrode EL1 has a thickness of, for example, 5 to 20 nm. The dielectric layer DIE is provided on the first electrode EL1, and is formed of, for example, zirconium oxide. The second electrode EL2 has a configuration where a TiN film and a W film are stacked, and fills the remaining space of the trench TRN3.

A third insulator film INSL31 is provided over the side face of the trench TRN3. The third insulator film INSL31 has a configuration similar to that of the second insulator layer INSL12 in the third embodiment. Specifically, the third insulator film INSL31 is a $SiO_{(1-x)}N_x$ (where x>0.1) film, and has a thickness of, for example, 5 nm or less. The first electrode EL1 is partially in contact with the third insulator film INSL31.

A via VA2 is embedded in the interlayer insulator film INSL3 while being coupled to the second electrode EL2.

In the exemplary case illustrated in FIG. 13A, the interconnection INC1 acts as the bit line, and the contact CON2 is coupled to the first electrode EL1 of the capacitive element CP. The via VA1 penetrates through the interlayer insulator films INSL2, INSL3, and INSL4. The contact CON3 penetrates through the interlayer insulator films INSL1, INSL2, INSL3, and INSL4.

In the logic region LR, no interconnection is provided on the interlayer insulator film INSL1. Instead, the contacts CON3 penetrate through the interlayer insulator films INSL1, INSL2, INSL3, and INSL4, so that undepicted interconnections in a layer above the interlayer insulator film INSL4 are coupled to the transistors TR2.

A method of manufacturing the semiconductor device SD according to the fourth embodiment is now described. First, the element isolation film STI, the transistors TR1 and TR2, the interlayer insulator film INSL1, the insulator film ETS1, the interconnections INC1 and INC2, the interlayer insulator film INSL2, the contacts CON1 and CON2, and portions of the contacts CONS, each portion being embedded in the interlayer insulator films INSL1 and INSL2, are sequentially formed in/on the substrate SUB. Such components are formed by the same processes as those in the first embodiment.

Subsequently, the interlayer insulator film INSL3 is formed over the interlayer insulator film INSL2. For example, the formation process of the interlayer insulator film INSL3 is the same as that of the interlayer insulator film INSL2. Subsequently, the trench TRN3 is formed in the interlayer insulator film INSL3. The trench TRN3 penetrates through the interlayer insulator film INSL3. The upper end of the contact CON2 is exposed on the bottom of the trench TRN3.

Subsequently, the third insulator film INSL31 is formed over the side face of the trench TRN3. The formation process of the third insulator film INSL31 is the same as that of the second insulator layer INSL12 described in the third embodiment.

Subsequently, a film to be the first electrode EL1, a film to be the dielectric layer DIE, and a film to be the second electrode EL2 are stacked in this order over the bottom and the side face of the trench TRN3 and over the interlayer insulator film INSL3. Subsequently, the films located on the interlayer insulator film INSL3 are removed. Consequently, the capacitive element CP is formed.

Subsequently, the interlayer insulator film INSL4 is formed over the interlayer insulator film INSL3. Subsequently, a coupling hole to be filled with the via VA2 is formed in the interlayer insulator film INSL4. In this step, a coupling hole to be filled with the contact CON3 and a coupling hole to be filled with the via VA1 are also formed in the interlayer insulator films INSL3 and INSL4. Subsequently, such coupling holes are filled with the via VA1, the via VA2, and the contact CON3.

In the fourth embodiment, the interconnections INC1 and INC2 each have a low resistance as with the first embodiment. Since the interconnection INC1 acts as the bit line, the low resistance of the interconnection INC1 leads to high-speed memory operation. The third insulator film INSL31 is provided over the side face of the trench TRN3. The third insulator film INSL31 is formed of a material similar to the material of the insulator film ETS1 in the first embodiment. Hence, the metal film configuring the first electrode EL1 has a large crystal grain size, resulting in low resistance of the first electrode EL1.

In addition, the first electrode EL1 has a high crystallinity due to the large crystal grain size. Consequently, the dielectric layer DIE has a crystal phase having a high dielectric constant. As a result, the capacitive element CP has a large capacity.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
    a substrate;
    an interlayer insulator film provided over the substrate,
    an insulator film provided over the interlayer insulator film, thinner than the interlayer insulator film, and comprised of $SiO_{(1-x)}N_x$ (where x>0.1); and
    an interconnection provided over the insulator film,
    wherein the interconnection includes a first layer on the insulator film and a second layer provided over the first layer,
    wherein the first layer includes at least one of TiN, TaN, WN, and RuN, and
    wherein the second layer is a W layer.

2. The semiconductor device according to claim 1, wherein the insulator film has a thickness of 10 to 100 nm.

3. The semiconductor device according to claim 1, wherein the first layer has an oxygen concentration of 2 at % or less.

4. A semiconductor device, comprising:
    a substrate;

a multilayer interconnection layer provided over the substrate;

a bit line provided over a first insulator layer of the multilayer interconnection layer;

a capacitive element provided in a layer above the first insulator layer of the multilayer interconnection layer; and a transistor provided in/on the substrate, and coupling the bit line to the capacitive element, wherein the first insulator layer is comprised of $SiO_{(1-x)}N_x$ (where $x>0.1$), and wherein the bit line includes a first layer and a second layer provided over the first layer, wherein the first layer includes at least one of TiN, TaN, WN, and RuN, and wherein the second layer is formed of a material having a resistance lower than the first layer.

5. A semiconductor device, comprising:

a substrate;

an insulator layer provided over the substrate, and having a trench; and a conductive layer filling the trench, wherein the insulator layer includes a first insulator film having the trench, and a second insulator film provided on the side face of the trench, wherein the second insulator film is a $SiO_{(1-x)}N_x$ film, wherein at least a side face of the trench is comprised of a $SiO_{(1-x)}N_x$ (where $x>0.1$) film, wherein the conductive layer includes a first layer provided over the side face and a bottom of the trench, and wherein the first layer includes at least one of TiN, TaN, WN, and RuN.

6. The semiconductor device according to claim 5, wherein the insulator layer is a $SiO_{(1-x)}N_x$ film.

7. The semiconductor device according to claim 5, wherein the conductive layer acts as an interconnection, and includes a W layer provided over the first layer.

8. The semiconductor device according to claim 6, further comprising a capacitive element filling the trench, wherein the conductive layer acts as a lower electrode of the capacitive element.

9. A semiconductor device, comprising:

an insulator film;

an interconnection provided over the insulator film; and a barrier metal film located between the interconnection and the insulator film, wherein the insulator film is formed of a material that releases oxygen more poorly than $SiO_2$, and wherein a profile of oxygen concentration in SIMS analysis in a thickness direction of the barrier metal film is not asymmetric with reference to the thickness center of the barrier metal.

* * * * *